US012749890B2

(12) United States Patent
Komano

(10) Patent No.: US 12,749,890 B2
(45) Date of Patent: Sep. 29, 2026

(54) SURGE SUPPRESSION DEVICE

(71) Applicant: Proterial, Ltd., Tokyo (JP)

(72) Inventor: Haruyasu Komano, Tokyo (JP)

(73) Assignee: Proterial, Ltd., Tokyo (JP)

( * ) Notice: Subject to any disclaimer, the term of this patent is extended or adjusted under 35 U.S.C. 154(b) by 169 days.

(21) Appl. No.: 18/418,135

(22) Filed: Jan. 19, 2024

(65) Prior Publication Data

US 2024/0250524 A1 Jul. 25, 2024

(30) Foreign Application Priority Data

Jan. 24, 2023 (JP) ................................ 2023-008698
Nov. 1, 2023 (JP) ................................ 2023-187459

(51) Int. Cl.
*H02H 9/04* (2006.01)
*H01C 1/16* (2006.01)
*H05K 1/16* (2006.01)
*H05K 1/18* (2026.01)

(52) U.S. Cl.
CPC ............... *H02H 9/044* (2013.01); *H01C 1/16* (2013.01); *H05K 1/167* (2013.01); *H05K 1/18* (2013.01); *H05K 2201/10015* (2013.01); *H05K 2201/10022* (2013.01); *H05K 2201/10522* (2013.01)

(58) Field of Classification Search
CPC .......... H02H 9/044; H01C 1/16; H05K 1/167; H05K 1/18; H05K 2201/10015; H05K 2201/10022; H05K 2201/10522; H01G 4/40
USPC .......................................................... 361/118
See application file for complete search history.

(56) References Cited

U.S. PATENT DOCUMENTS 7,164,573 B1 * 1/2007 Prymak .................. H01G 4/232 361/321.1
2008/0026136 A1 * 1/2008 Skamser ............. H01G 4/0085 156/89.12
2011/0043963 A1 * 2/2011 Bultitude ................ H01G 2/16 29/25.42
2022/0045570 A1 * 2/2022 Sagawa .................. H02H 9/041
2022/0294210 A1 * 9/2022 Fukuchi ................... H02H 7/09

FOREIGN PATENT DOCUMENTS

JP 2014132811 A * 7/2014
TW 201541474 A * 11/2015

* cited by examiner

*Primary Examiner* — Sreeya Sreevatsa
(74) *Attorney, Agent, or Firm* — Studebaker Brackett PLLC

(57) ABSTRACT

A surge suppression device is provided with a resistor, and a capacitor electrically connected to the resistor. The resistor includes a substrate and a resistive-conducting layer composed of a sintered resistive paste provided on the substrate.

14 Claims, 10 Drawing Sheets

SURGE SUPPRESSION DEVICE

CROSS-REFERENCE TO RELATED APPLICATIONS

The present application is based on Japanese patent application No. 2023-8698 filed on Jan. 24, 2023 and Japanese patent application No. 2023-187459 filed on Nov. 1, 2023, the entire contents of which are incorporated herein by reference.

TECHNICAL FIELD

The present invention relates to a surge suppression device (i.e., surge suppressor).

BACKGROUND OF THE INVENTION

Patent Literature 1 discloses a surge suppression device for suppressing the occurrence of surge voltage in the wiring of three-phase alternating current from an inverter to a motor. The surge suppression device of Patent Literature 1 has three series circuits each composed of a resistor and a capacitor, and the three series circuits are connected to each other on the capacitor side terminals.

Citation List Patent Literature 1: JP2014-132811A

SUMMARY OF THE INVENTION

Here, there is no detailed disclosure of the structure of the surge suppression device in Patent Literature 1, and there is room for improvement from the viewpoint of downsizing the surge suppression device.

This invention was made in view of the aforementioned circumstances, and it is an object to provide a surge suppression device that can be downsized.

In order to achieve the aforementioned purpose, this invention provides a surge suppression device comprising a resistor; and a capacitor electrically connected to the resistor, wherein the resistor includes a substrate and a resistive-conducting layer composed of a sintered resistive paste provided on the substrate.

Advantageous Effects of the Invention

According to this invention, it is possible to provide a surge suppression device that can be downsized.

DETAILED DESCRIPTION OF THE INVENTION

First Embodiment

The first embodiment of this invention will be described with reference to FIGS. 1 to 5. The embodiments are shown as suitable examples for implementing the invention, and although there are parts that specifically illustrate various technically preferred technical matters, the technical scope of the invention is not limited to this aspect.

Figure 1:
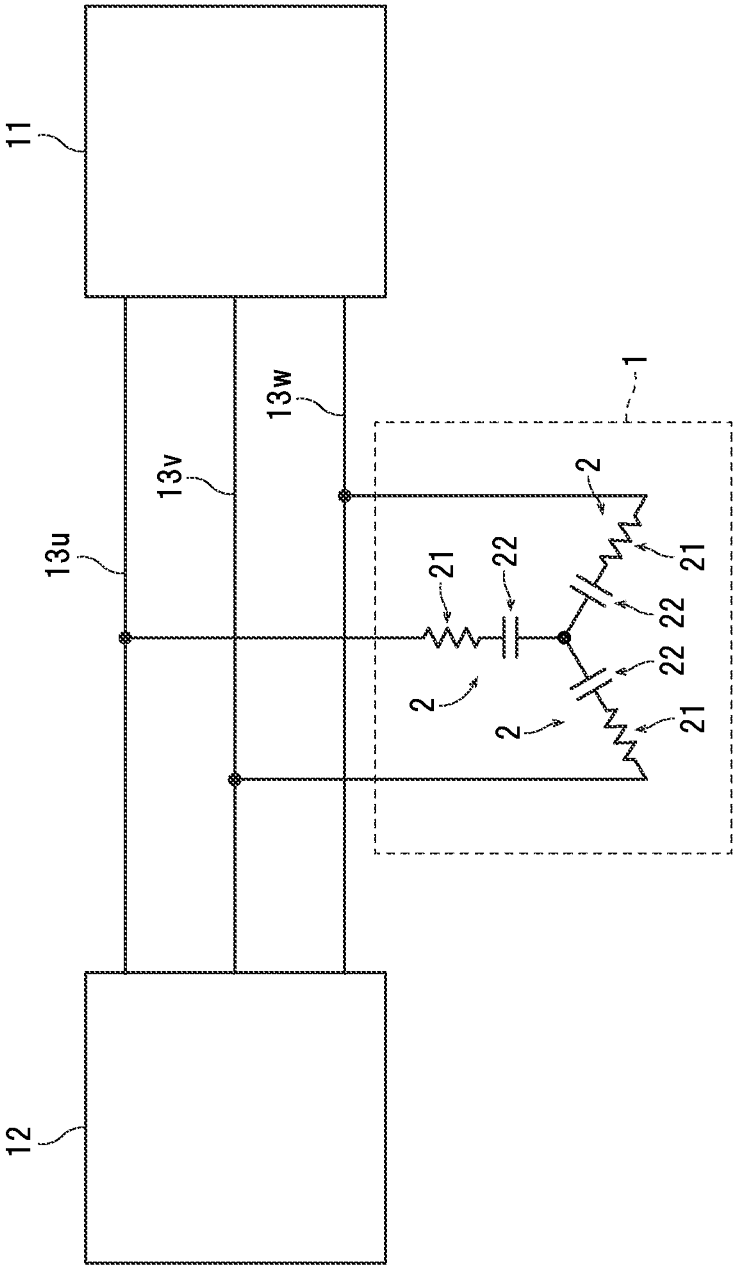
FIG. 1 is a circuit diagram of a surge suppression device in use in the first embodiment.

FIG. 1 is a circuit diagram showing a surge suppression device 1 in use. The surge suppression device 1 is used to be, for example, connected to a U-phase wiring 13*u*, a V-phase wiring 13*v*, and a W-phase wiring 13*w*, respectively, between a motor 11 and an inverter 12. In this case, the surge suppression device 1 suppresses the application of surge voltage to the motor 11. The surge suppression device 1 has three series circuits 2 each of which includes a resistor 21 and a capacitor 22 that are connected in series. The three series circuits 2 are connected to the U-phase wiring 13*u*, V-phase wiring 13*v*, or W-phase wiring 13*w*, respectively, on the resistor 21-side. The three series circuits 2 are star-connected by connecting the respective capacitor 22-sides to each other. The surge suppression device 1 will be detailed hereinafter.

Figure 2:
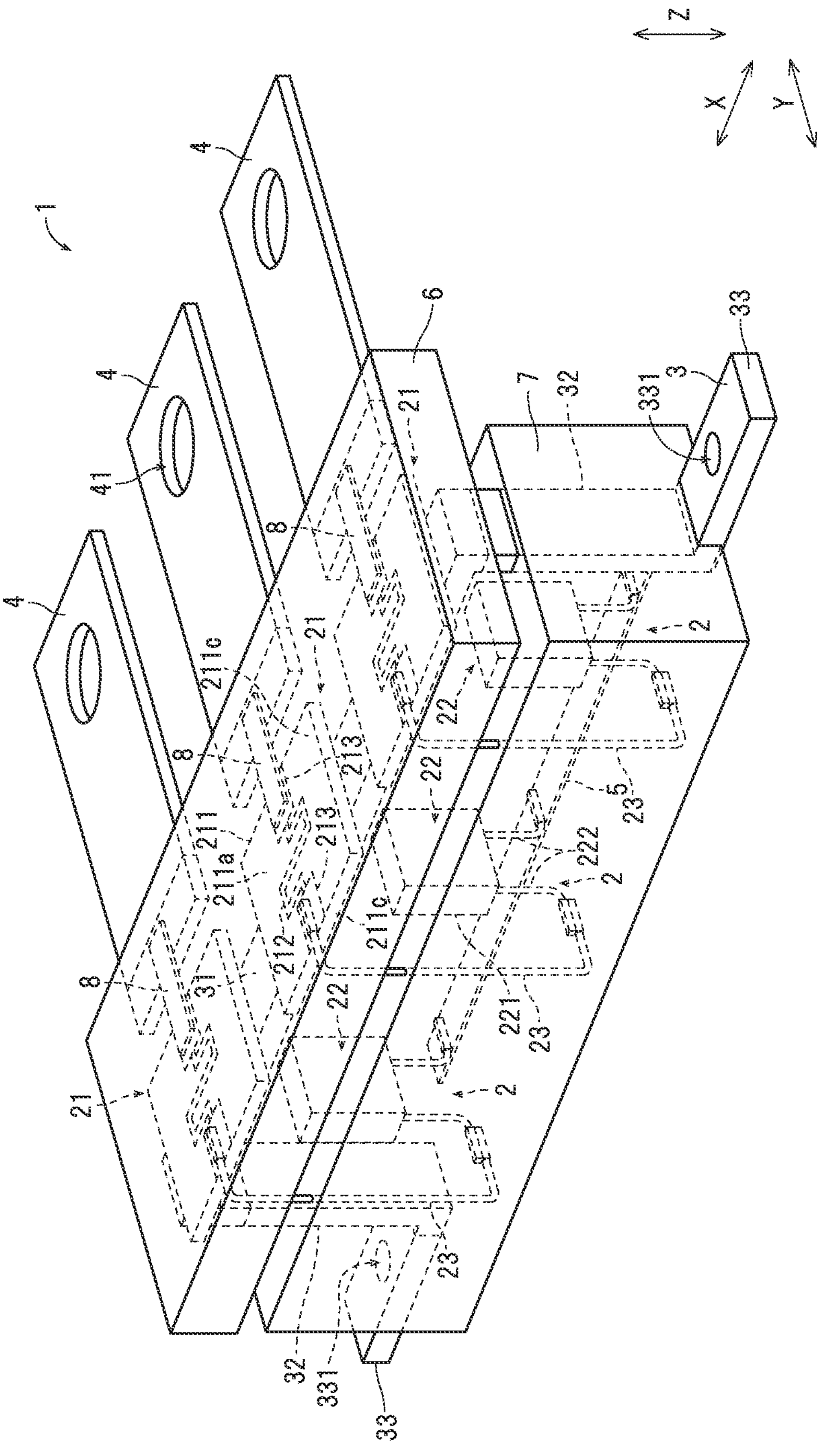
FIG. 2 is a perspective view of the surge suppression device in the first embodiment.
Figure 3:
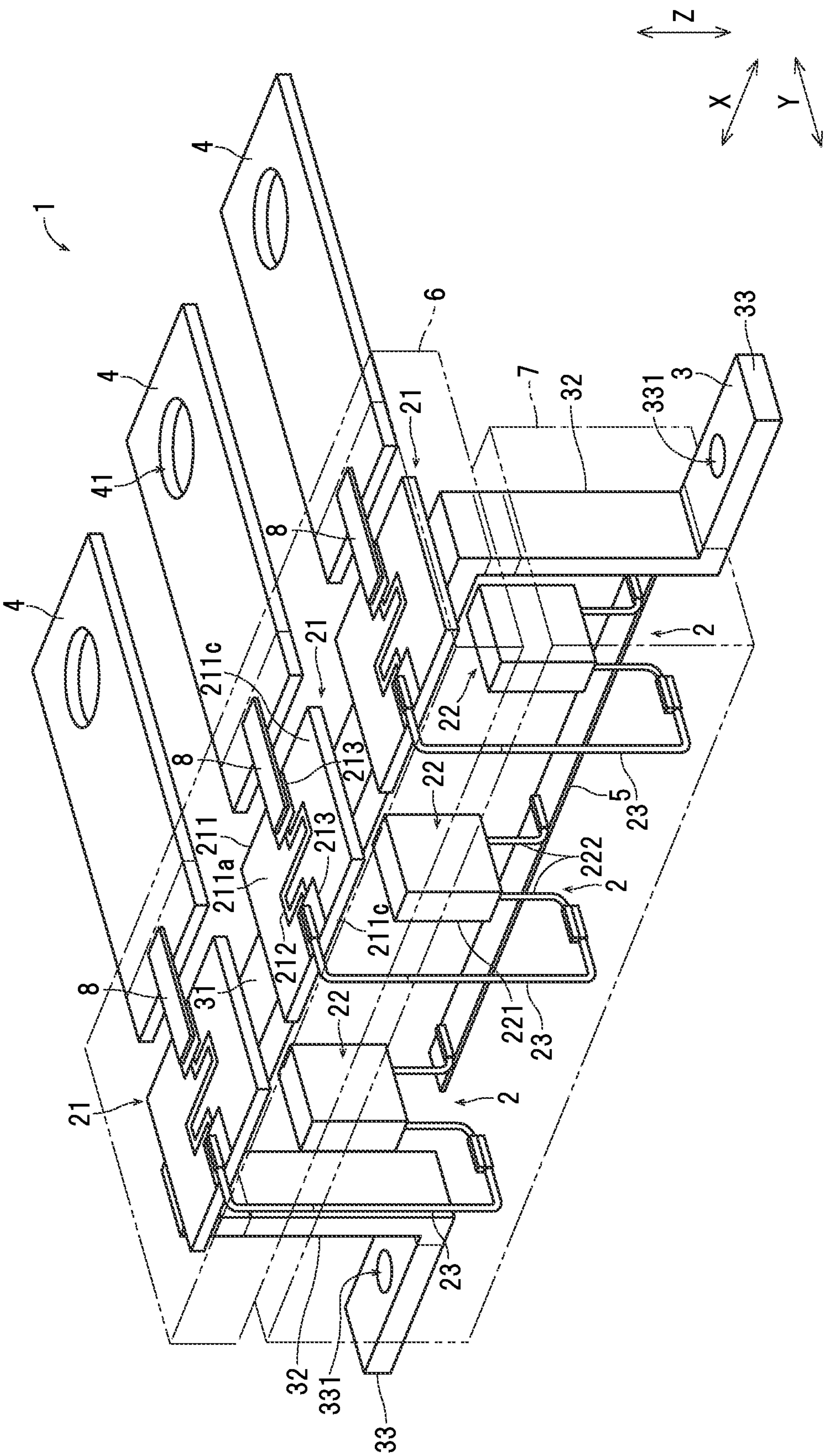
FIG. 3 is a perspective view of the surge suppression device in the first embodiment, omitting the resistor-embedding resin and the capacitor-embedding resin.
Figure 4:
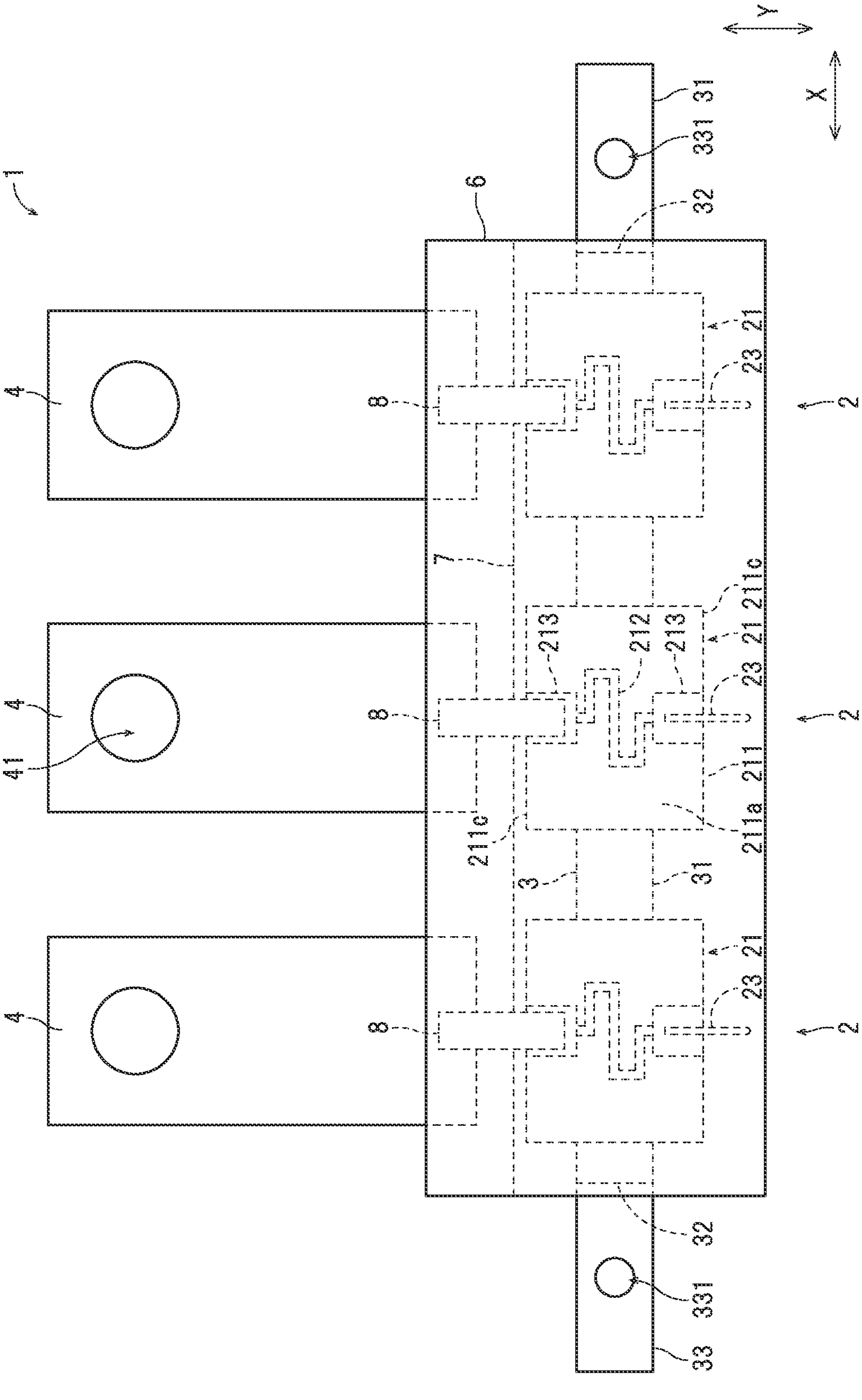
FIG. 4 is a plan view of the surge suppression device in the first embodiment.
Figure 5:
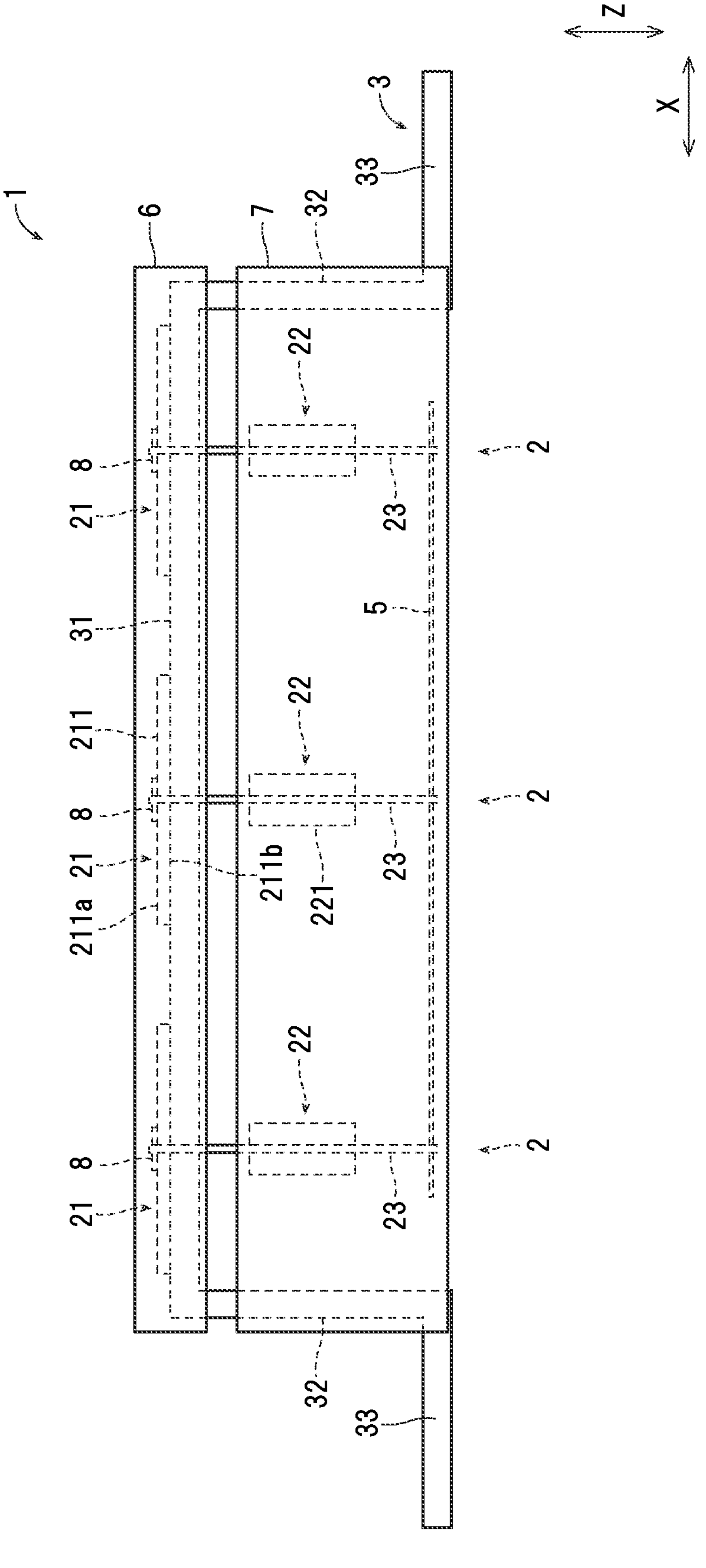
FIG. 5 is a back view of the surge suppression device in the first embodiment.

FIG. 2 is a perspective view of the surge suppression device 1. FIG. 3 shows a perspective view of the surge suppression device 1, omitting a resistor-embedding resin and a capacitor-embedding resin. FIG. 4 is a plan view of the surge suppression device 1. FIG. 5 is a back view of the surge suppression device 1.

The surge suppression device 1 has three resistors 21, a bracket 3, three terminals 4, three capacitors 22, an interconnection 5, a resistor-embedding resin 6, and a capacitor-embedding resin 7. The resistor 21 has a substrate 211 and a resistive-conducting layer 212 made of sintered resistive paste formed on the substrate 211. The bracket 3 fixes the substrates 211 of the three resistors 21 and is fixed to an external, not shown, fixing object (e.g., motor case). The three terminals 4 are connected to the three resistors 21 respectively. The three capacitors 22 are connected to the opposite side with respect to the terminal 4-sides in the three resistors 21 respectively. The interconnection 5 electrically connects the opposite sides of the connections 23 in the three capacitors 22. The resistor-embedding resin 6 embeds the three resistors 21 collectively. The capacitor-embedding resin 7 embeds the three capacitors 22 collectively. Each part of the surge suppression device 1 will be detailed hereinafter.

As shown in FIGS. 2 to 4, the three resistors 21 are arranged in a row. The direction in which the three resistors 21 are aligned is referred to as an X-direction. The resistor 21 has a substrate 211, a pair of electrodes 213, and a resistive-conducting layer 212 formed on a frontside 211*a* of the substrate 211. The substrate 211 has a rectangular plate shape with a thickness in a direction orthogonal to the X-direction. The thickness direction of the substrate 211 is referred to as a Z-direction, and a direction orthogonal to both the X- and Z-directions is referred to as a Y-direction.

The substrate 211 is made of a material that has electrical insulation and good thermal conductivity. For example, the substrate 211 can be made of aluminum oxide.

The pair of electrodes 213 are formed at both ends of the Y-direction of the frontside 211*a* of the substrate 211, and the resistive-conducting layer 212 is formed to connect the pair of electrodes 213. The resistive-conducting layer 212 is made by sintering a resistive paste including ruthenium oxide, nickel-copper, or the like. The resistive-conducting layer 212 is formed to meander on both sides of the X-direction as it moves from one electrode 213 to the other electrode 213. This allows the length of the resistive-conducting layer 212 to be secured to achieve the desired resistance of the resistor 21, while at the same time reducing the size of the resistor 21. A backside 211*b* of the substrate 211 of each of the three resistors 21 is in contact with the bracket 3.

The bracket 3 is contacted by the three resistors 21 and fixed to an external fixing object. The bracket 3 is made of a crank-shaped metal having thermal conductivity, such as aluminum. The bracket 3 has the role of being secured to the fixing object and dissipating the heat of the three resistors 21 to the fixing object.

The bracket 3 has a first portion 31 extending in the X-direction to which the backside 211*b* of the substrate 211 of each of the three resistors 21 is welded or otherwise fixed, a pair of second portions 32 extending from both sides of the first portion 31 to the opposite side to the resistor 21-side in the Z-direction, and a pair of third portions 33 extending outwardly in the X-direction from the ends of the second portions 32 opposite with respect to the first portion 31. In the substrate 211, its center portion in the Y-direction is fixed to the first portion 31 of the bracket 3, and protruding portions 211*c* that are both sides of the substrate 211 protrude in the Y-direction from the first portion 31. Each of a pair of protruding portions 211*c* has an electrode 213. This allows a creepage distance between each electrode 213 and the bracket 3 to be earned, which facilitates securing electrical insulation between them. Bolt-insertion holes 331 are formed in the third portions 33 for inserting bolts for fixing to the fixing object.

Three terminals 4 are electrically connected to one electrode 213 of each of the three resistors 21. The three terminals 4 are arranged on one sides in the Y-direction of the three resistors 21 and in a parallel orientation to the three resistors 21. The terminal 4 is made of metal, such as pure copper. The three terminals 4 are electrically connected to the U-phase wiring (see 13*u* in FIG. 1), the V-phase wiring (see 13*v* in FIG. 1), or the W-phase wiring (see 13*w* in FIG. 1), respectively. The terminal 4 has a bolt-insertion hole 41 for connection to the U-phase wiring (see 13*u* in FIG. 1), the V-phase wiring (see 13*v* in FIG. 1), or the W-phase wiring (see 13*w* in FIG. 1). The terminal 4 is connected to the electrode 213 via a relay bus-bar 8. Not limited thereto, the terminal 4 and the relay bus-bar 8 may be formed integrally (as one piece).

Each of three connections 23 is electrically connected to each of other electrodes 213 of the three resistors 21. The connection 23 electrically connects the resistor 21 and the capacitor 22, which constitute the series circuit 2, and are in the form of a conductive wire bent into a U-shape. In the present embodiment, the connection 23 is made of a metallic material with lower thermal conductivity than the relay bus-bar 8. This increases the thermal resistance in the thermal path from the resistor 21 to the capacitor 22 through the connection 23 and reduces the heat transferred from the resistor 21 to the capacitor 22.

A cross-sectional area of the connection 23 is smaller than a cross-sectional area of the relay bus-bar 8. The cross-sectional area of the connection 23 is the area of the cross-section orthogonal to the thermal path from the resistor 21 to the capacitor 22 via the connection 23, and the cross-sectional area of the relay bus-bar 8 is the area of the cross-section orthogonal to the thermal path from the resistor 21 to the terminal 4 via the relay bus-bar 8 (i.e., the cross-section orthogonal to the Y-direction). A width of the connection 23 is smaller than a width of the relay bus-bar 8. A thickness of the connection 23 is smaller than that of the relay bus-bar 8. These make it easier for the thermal resistance at the connection 23 to be greater than the thermal resistance of the relay bus-bar 8, thereby reducing the heat transferred from the resistor 21 to the capacitor 22 through the connection 23.

The capacitor 22 is located on one side of the substrate 211 in the thickness direction (specifically the backside 211*b*) in the connected resistor 21. The first portion 31 of the bracket 3 is interposed between the capacitor 22 and the resistor 21 that are connected to each other. The capacitor 22 may be, for example, a ceramic capacitor, and has a capacitor body 221 in which a capacitor element is coated with resin, and two capacitor terminals 222 protruding from the capacitor body 221. One capacitor terminal 222 is connected to the opposite side to the resistor 21 of the connection 23. The ends on the opposite side of the connections 23 in the capacitors 22 are connected to each other at the interconnection 5. The interconnection 5 is a bus-bar that is long in the X-direction and thick in the Z-direction.

The three resistors 21 are embedded in the resistor-embedding resin 6, and the three capacitors 22 are embedded in the capacitor-embedding resin 7. The resistor-embedding resin 6 has a rectangular shape flattened in the Z-direction and embeds at least the three resistors 21, the first portion 31 of the bracket 3, the three relay busbars 8, respective roots of the three terminals 4, and respective resistor 21-side ends of the three connections 23. The capacitor-embedding resin 7 has a rectangular shape and embeds at least the three capacitors 22, the interconnection 5, parts of portions exposed from the resistor-embedding resin 6 of the three connections 23, and the second portion 32 of the bracket 3. As shown in FIG. 5, the resistor-embedding resin 6 and the capacitor-embedding resin 7 are separated from each other. This prevents the heat of the resistor 21 from being easily transferred to the capacitor 22 through the resistor-embedding resin 6 and the capacitor-embedding resin 7.

Each of the resistor-embedding resin 6 and the capacitor-embedding resin 7 is molded in a mold. Each of the resistor-embedding resin 6 and the capacitor-embedding resin 7 comprises a base resin having electrical insulation and a filler having a higher thermal conductivity than the base resin. The base resin is made of an electrically insulating resin, such as PPS (polyphenylene sulfide) resin or epoxy resin. The filler can be composed of metal or ceramic powder, for example, aluminum oxide, boron nitride, or aluminum nitride. The thermal conductivity of each of the resistor-embedding resin 6 and the capacitor-embedding resin 7 is preferably 3 W/(m·K) or more. The thermal conductivity of each the resistor-embedding resin 6 and the capacitor-embedding resin 7 can be 10 W/(m·K) or less.

Functions and Effects of the First Embodiment

In the surge suppression device 1 of the first embodiment, the resistor 21 has the substrate 211 and the resistive-conducting layer 212 made of sintered resistive paste formed on the substrate 211. This facilitates miniaturization of the resistor 21, which in turn facilitates miniaturization of the entire surge suppression device 1.

The resistive-conducting layer 212 has a serpentine shape. Hence, the resistor 21 can be suppressed from becoming larger while ensuring the length of the resistive-conducting layer 212.

The capacitor 22 is located on one side of the substrate 211 in the thickness direction of the substrate 211. By arranging the resistor 21 and the capacitor 22 in this manner, it is easier to further reduce the size of the surge suppression device 1.

The bracket 3, which faces and contacts the substrate 211 of the resistor 21 and is fixed to the fixing object, is further provided. Hence, the heat of the resistor 21 can be dissipated through the bracket 3 to the fixing object.

At least a part of the bracket 3 is interposed between the resistor 21 and the capacitor 22. Hence, heat transfer from the bracket 3 to the capacitor 22 can be suppressed.

The substrate 211 has the pair of protruding portions 211*c* protruding on both sides from the bracket 3, and the electrodes 213 of the resistor 21 are formed on the protruding portion pair 211*c*. Hence, the creepage distance from the electrode 213 to the bracket 3 can be earned, and electrical insulation between the resistor 21 and the bracket 3 is easily ensured.

The surge suppression device 1 further comprises the resistor-embedding resin 6 in which the resistor 21 is embedded and the capacitor-embedding resin 7 in which the capacitor 22 is embedded, and the resistor-embedding resin 6 and the capacitor-embedding resin 7 are arranged at a distance from each other. Hence, the heat transfer from the resistor 21 to the capacitor 22 via the resistor-embedding resin 6 and the capacitor-embedding resin 7 can be suppressed.

Each of the resistor-embedding resin 6 and the capacitor-embedding resin 7 has the base resin and the filler having a higher thermal conductivity than the base resin.

Hence, the heat of the resistor 21 is diffused into the resistor-embedding resin 6 for efficient heat dissipation, and the heat of the capacitor 22 is diffused into the capacitor-embedding resin 7 for efficient heat dissipation.

As described above, according to the present embodiment, it is possible to provide a surge suppression device that can be miniaturized.

Second Embodiment

Figure 6:
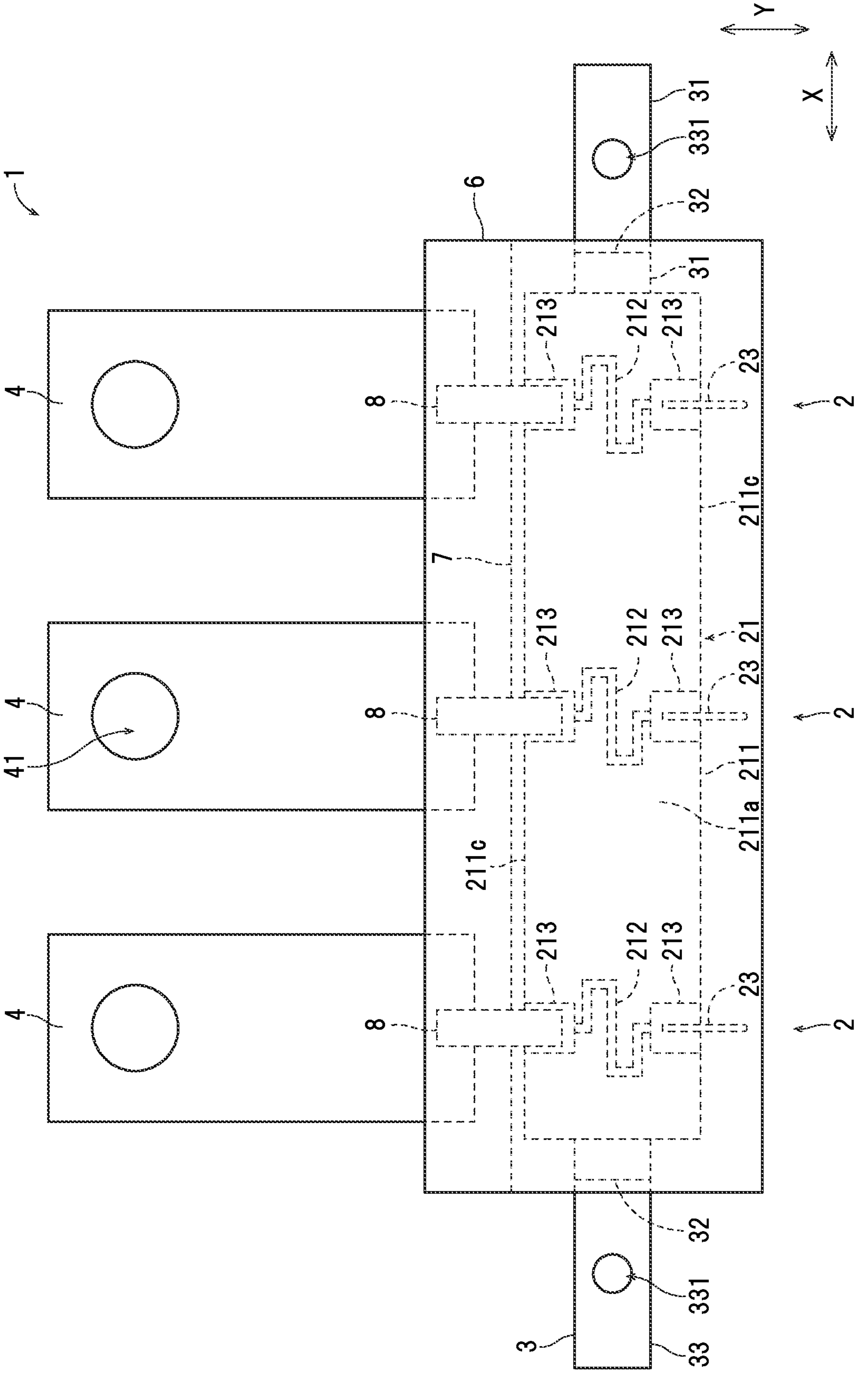
FIG. 6 is a plan view of a surge suppression device in the second embodiment.

FIG. 6 is a plan view of a surge suppression device 1 in the present embodiment.

In the present embodiment, a resistor 21 has one substrate 211 long in the X-direction, as well as a resistive-conducting layer 212 and a pair of electrodes 213 formed at three locations in the X-direction on the substrate 211.

The other configuration is similar to that of the first embodiment. The same characters used in the subsequent embodiment as those used in the first embodiment represent the same components as those in the first embodiment, unless otherwise indicated.

Functions and Effects of the Second Embodiment

The resistor 21 has the substrate 211 as well as the resistive-conducting layer 212 and the pair of electrodes 213 formed at different locations on the substrate 211, thereby reducing the number of parts. Other functions and effects are the same as those of the first embodiment.

Third Embodiment

Figure 7:
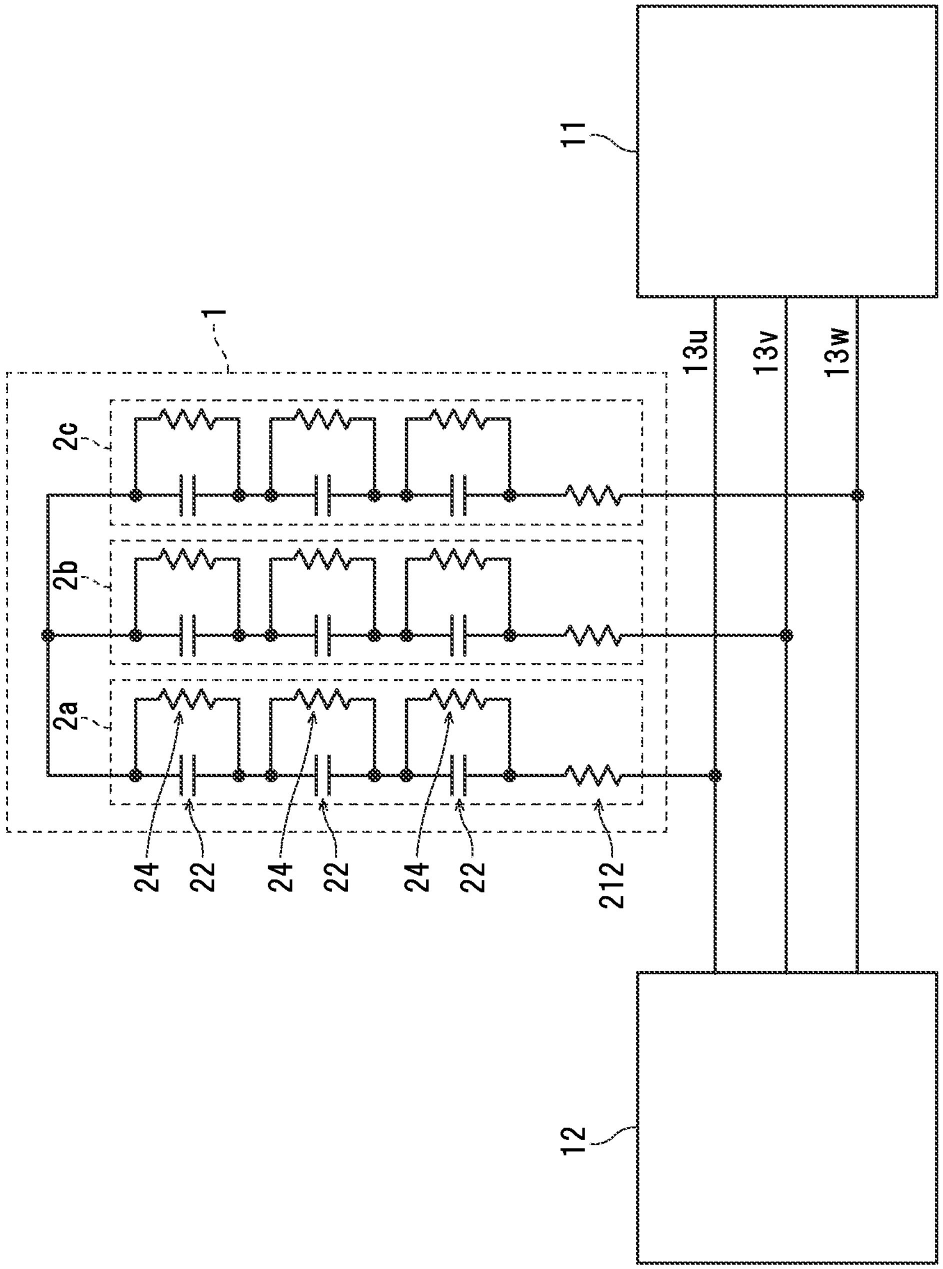
FIG. 7 is a circuit diagram of a surge suppression device in use in the third embodiment.

FIG. 7 is a circuit diagram of the surge suppression device 1 in use in the present embodiment.

In the present embodiment, a surge suppression device 1 has first to third series circuits 2*a* to 2*c*, each of which comprises a resistive-conducting layer 212 and a capacitor 22 that are connected in series. Each of the first to third series circuits 2*a* to 2*c* has one resistive-conducting layer 212 and three capacitors 22 connected in series to the resistive-conducting layer 212. Each of the first to third series circuits 2*a* to 2*c* has three balance resistors 24 connected in parallel to respective capacitors 22. In the first series circuit 2*a*, the resistive-conducting layer 212-side is connected to the U-phase wiring 13*u*, in the second series circuit 2*b*, the resistive-conducting layer 212-side is connected to the V-phase wiring 13*v*, and in the third series circuit 2*c*, the resistive-conducting layer 212-side is connected to the W-phase wiring 13*w*. The first to third series circuits 2*a* to 2*c* are star-connected by having their respective resistive-conducting layers 212 and opposite sides connected to each other.

Figure 8:
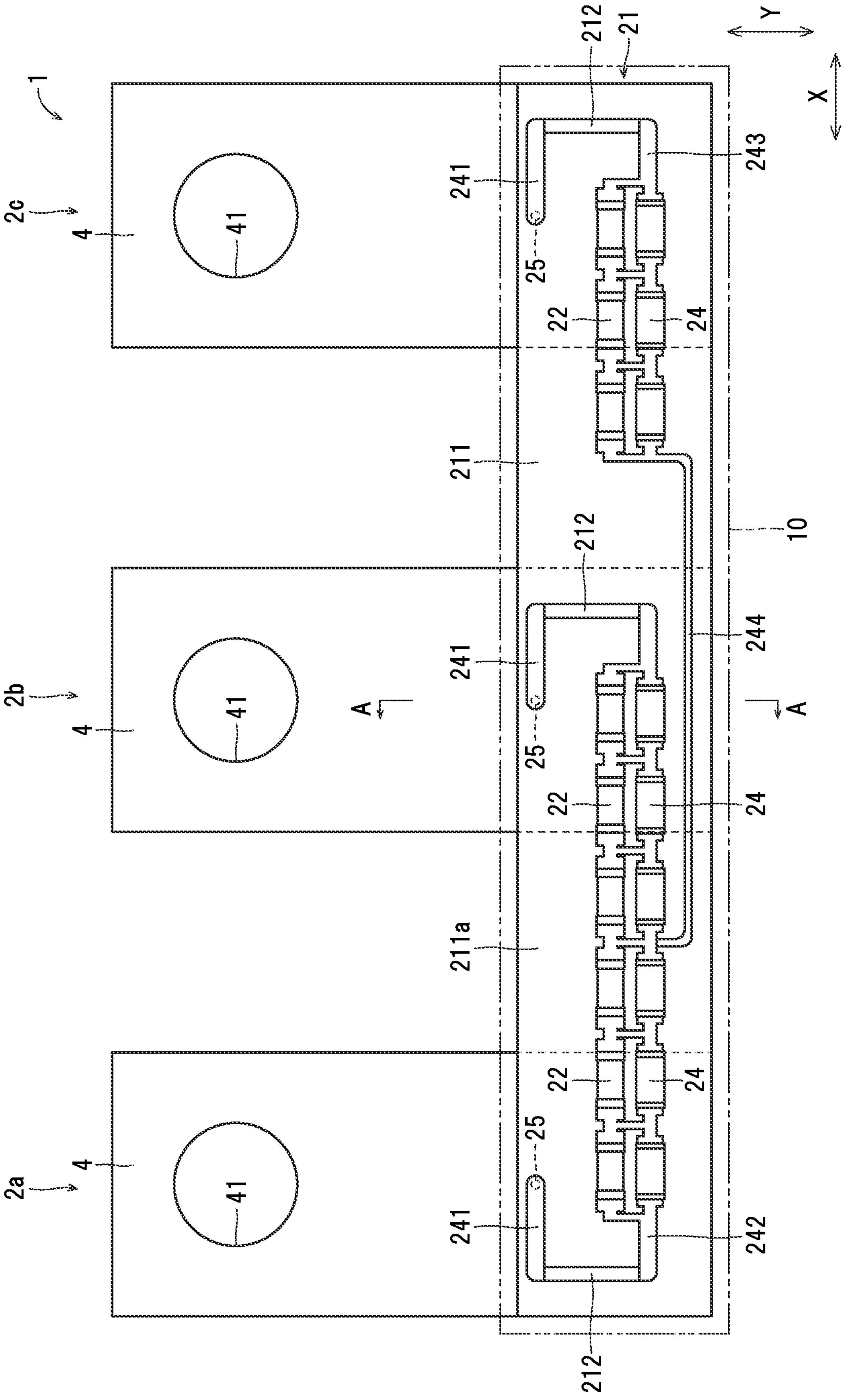
FIG. 8 is a plan view of the surge suppression device in the third embodiment.
Figure 9:
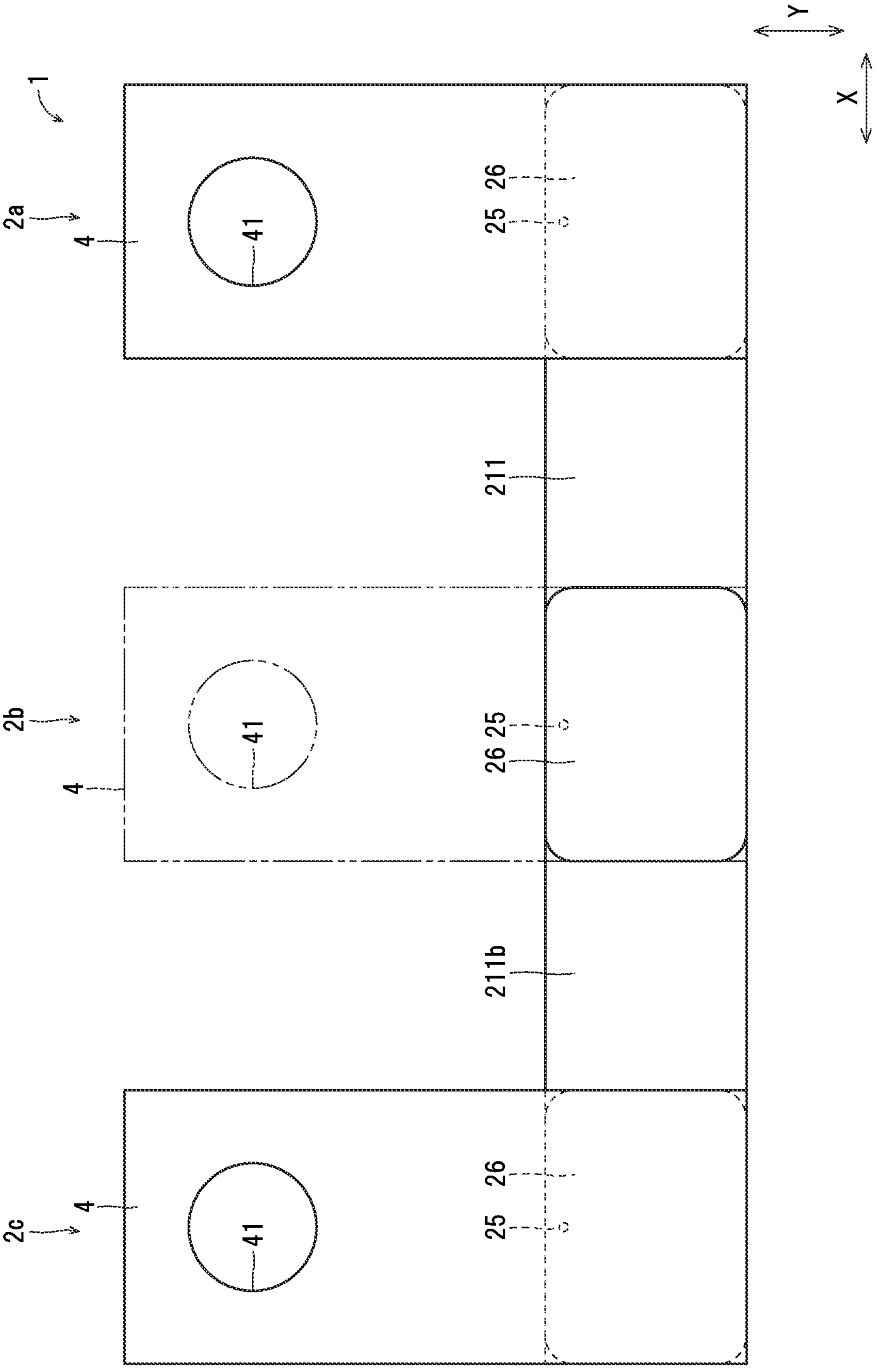
FIG. 9 is a bottom view of three terminals and a substrate in the third embodiment.

FIG. 8 is a plan view of the surge suppression device 1 in the present embodiment. FIG. 9 is a bottom view of the three terminals 4 and the substrate 211. In FIG. 9, the terminal 4 at a center position of the three terminals 4 is represented by a double-dashed line only at the outer outline position.

As shown in FIG. 8, in the present embodiment, plural resistive-conducting layers 212 and plural capacitors 22 are integrated on a single substrate 211. The surge suppression device 1 includes one substrate 211, three resistive-conducting layers 212 formed on the substrate 211, nine capacitors 22 and nine balance resistors 24 constituting the first to third series circuits 2*a* to 2*c*, three terminals 4 electrically connected to three resistive-conducting layers 212 respectively, and an embedding resin 10 that embeds the substrate 211 together with mounted components. In FIG. 8, the embedding resin 10 is represented by a double-dashed line only at the outline position.

The substrate 211 is formed long in one direction. The longitudinal direction of the substrate 211 is the X-direction, the shortitudinal direction of the substrate 211 is the Y-direction, and the direction orthogonal to both the X- and Y-directions is the Z-direction. As shown in FIG. 8, on a frontside 211*a* of the substrate 211, frontside-patterns 241 to 244, three resistive-conducting layers 212, nine capacitors 22 and nine balance resistors 24 are arranged, and as shown in FIG. 9, on a backside 211*b* of the substrate 211, three backside-patterns 26 are arranged.

As shown in FIG. 8, the frontside-patterns 241 to 244 are composed of first to fourth frontside-patterns 241 to 244 patterned on the frontside 211*a* of the substrate 211.

The three first frontside-pattern 241 are connected to respective one ends of the three resistive-conducting layers 212. The first frontside-pattern 241 is formed in a long straight line in the X-direction. In the first frontside-pattern 241, one end in the X-direction is connected to the resistive-conducting layer 212, and the other end in the X-direction is connected to the terminal 4 via a through-conductive portion 25, a backside-pattern 26, and a conductive bonding layer 27 to be described later.

The second frontside-pattern 242 is connected to the opposite end of the two resistive-conducting layers 212 constituting the first and second series circuits 2*a*, 2*b*, with respect to the first frontside-pattern 241. The second frontside-pattern 242 mounts six capacitors 22 and six balance resistors 24 constituting the first and second series circuits 2*a*, 2*b*.

The third frontside-pattern 243 is connected to the opposite end of the resistive-conducting layer 212 constituting the third series circuit 2*c* with respect to the first frontside-pattern 241. The third frontside-pattern 243 mounts three capacitors 22 and three balance resistors 24 constituting the third series circuit 2*c*.

The three resistive-conducting layers 212 are each formed in a long straight line in the Y-direction. In the present embodiment, the resistive-conducting layer 212 is formed longitudinally in the longitudinal direction of the terminal 4. The resistive-conducting layer 212 may be formed long in a direction other than the Y-direction (e.g., the X-direction) or may have a meandering shape as in the first and second embodiments. The resistive-conducting layer 212 has one end in its longitudinal direction connected to one end of the first frontside-pattern 241 and the other end in its longitudinal direction connected to the second frontside-pattern 242. The resistive-conducting layer 212 is composed of, for example, a sintered body of a $LaB_6$ (lanthanum boride)-based resistive paste.

The resistive-conducting layer 212 is arranged in a position overlapping in the Z-direction with the electrically connected terminal 4. In the surge suppression device 1, the resistive-conducting layer 212 is particularly susceptible to high heat, and by arranging the resistive-conducting layer 212 and the terminal 4 in a position overlapping in the Z-direction, heat dissipation from the resistive-conducting layer 212 through the substrate 211 to the terminal 4 is facilitated. The entire resistive-conducting layer 212 is arranged in a position overlapping in the Z-direction with the terminal 4 to be electrically connected.

The resistive-conducting layer 212 is formed at a position biased to one side from the center position in the X-direction of the electrically connected terminal 4. Specifically, each resistive-conducting layer 212 constituting the first and third series circuits 2*a*, 2*c* is formed at a position biased outward in the X-direction from the center position of the terminal 4 to be electrically connected, and the resistive-conducting layer 212 constituting the second series circuit 2*b* is formed at a position biased outward in the X-direction from the center position of the terminal 4 to be electrically connected to the resistive-conducting layer 212-side constituting the third series circuit 2*c*. As a result, a space is secured on the frontside of the substrate 211, overlapping with the terminal 4, and at least a part of components other than the resistive-conducting layer 212 (the capacitor 22 and the balance resistor 24 in the present embodiment) can be mounted, thereby ensuring heat dissipation of these components.

The second frontside-pattern 242 is formed between the two resistive-conducting layers 212 constituting the first and second series circuits 2*a*, 2*b*, and a third frontside-pattern 243 is formed on the second frontside-pattern 242ˆside in the resistive-conducting layer 212 constituting the third series circuit 2*c*. As mentioned above, plural capacitors 22 and plural balance resistors 24 are mounted on the second and third frontside-patterns 242, 243.

The capacitor 22 is a chip capacitor and the balance resistor 24 is a chip resistor. The balance resistor 24 suppresses the voltage imbalance caused by connecting the plural capacitors 22 in series.

The six capacitors 22 constituting the first and second series circuits 2*a*, 2*b* are arranged in a row in the X-direction, and the six balance resistors 24 constituting the first and second series circuits 2*a*, 2*b* are arranged in a row in the X-direction at a position opposite with respect to the first frontside-pattern 241 in the six capacitors 22. The three capacitors 22 constituting the third series circuit 2*c* are arranged in a row in the X-direction, and the three balance resistors 24 constituting the third series circuit 2*c* are arranged in a row in the X-direction on the opposite side with respect to the first frontside-pattern 241 in the capacitors 22. The nine capacitors 22 are arranged in the same position in the Y-direction, and the nine balance resistors 24 are arranged in the same position in the Y-direction. The number of capacitors 22 and the number of balance resistors 24 can be changed as needed. For example, if plural capacitors 22 are not connected in series, the balance resistors 24 can be omitted.

In each of the first to third series circuits 2*a* to 2*c*, at least the capacitor 22 and the balance resistor 24 closest to the resistive-conducting layer 212 are arranged in a position overlapping in the Z-direction with the terminal 4. Each of the first to third series circuits 2*a* to 2*c* has the two capacitors 22 and the two balance resistors 24 on the side closest to the resistive-conducting layer 212 arranged in a position overlapping in the Z-direction with the terminal 4.

The fourth frontside-pattern 244 electrically connects the second frontside-pattern 242 and the third frontside-pattern 243. The fourth frontside-pattern 244 electrically connects the portion between the first series circuit 2*a* and the second series circuit 2*b* in the second frontside-pattern 242 and the end opposite with respect to the resistive-conducting layer 212 in the third frontside-pattern 243.

Figure 10:
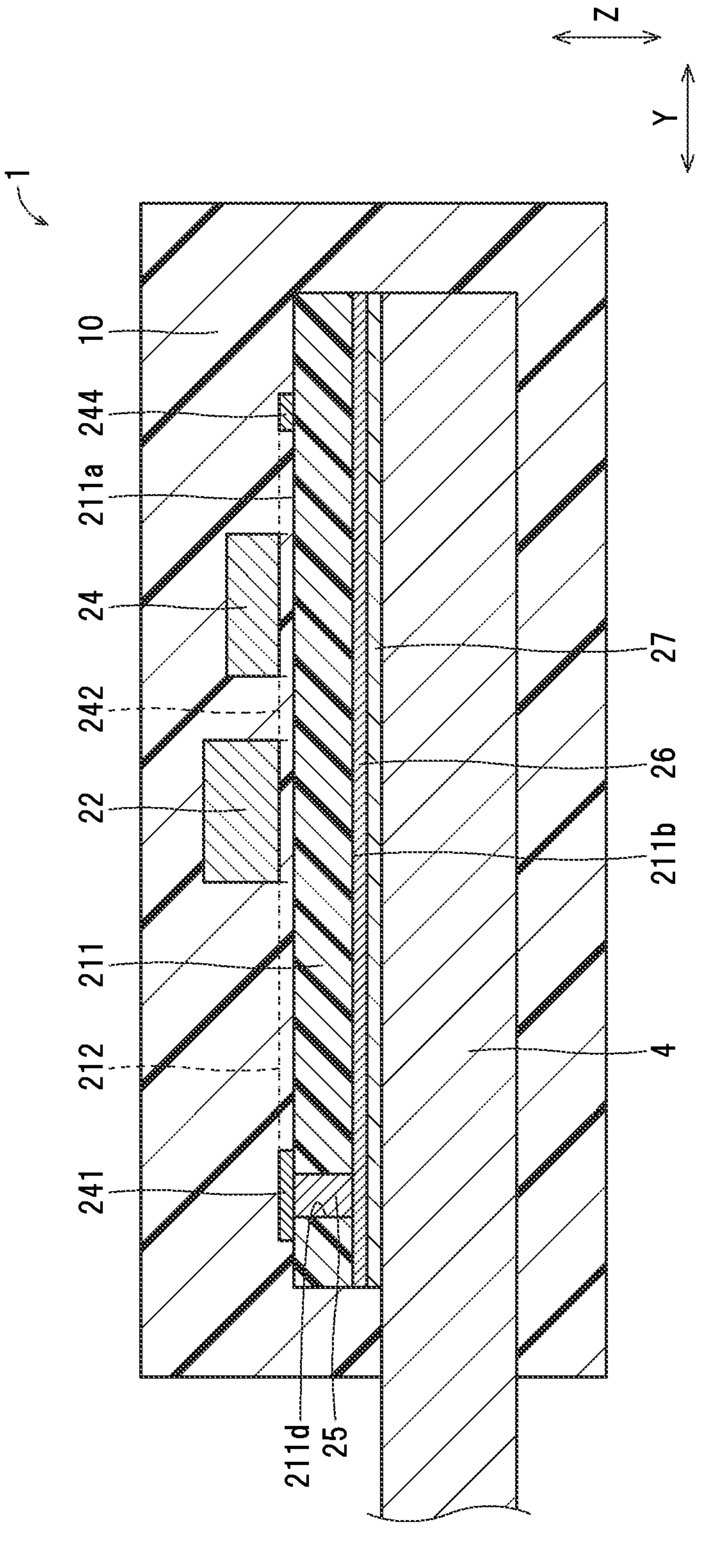
FIG. 10 is a sagittal cross-sectional view along A-A line in FIG. 8.

The three first frontside-patterns 241 are connected to the three through-conductive portions 25, respectively. FIG. 10 is a sagittal cross-sectional view along A-A line in FIG. 8. As shown in FIG. 10, the through-conductive portions 25 are filled in through-holes 211*d* formed in the substrate 211. The through-conductive portion 25 can be formed, for example, by filling a copper-based paste material into the through-hole 211*d* and sintering the paste material. The through-conductive portion 25 can be a hollow one formed on an inner surface of the through-hole 211*d*, for example, but from the viewpoint of improving the heat dissipation of the resistive-conducting layer 212 and lowering the electrical resistance of the through-conductive portion 25, it is preferable to be filled within the through-hole 211*d* of the substrate 211.

As shown in FIG. 8, the through-conductive portion 25 is formed at a distance from the resistive-conducting layer 212. This suppresses the generation of thermal stress between the through-conductive portion 25 and the substrate 211 due to the high temperature of the through-conductive portion 25 receiving heat from the resistive-conducting layer 212. The through-conductive portion 25 is located at the center of the electrically connected terminal 4 in the X-direction. The through-conductive portion 25 may be connected directly to the resistive-conducting layer 212, for example. If the resistive-conducting layer 212 and the terminal 4 are electrically connected, the through-conductive portion 25 may not be provided (i.e., may be omitted). The terminal 4 may be electrically connected to the first frontside-pattern 241 by, e.g., wire bonding. As shown in FIG. 10, the backsides of the three through-conductive portions 25 are connected to the three backside-patterns 26 respectively.

As shown in FIGS. 9 and 10, the backside-pattern 26 is widely formed to face the terminal 4 to be connected. The backside-pattern 26 is widely formed so as to face half or more (approximately the entire area in the present embodiment) of the area facing the substrate 211 in the terminal 4.

As shown in FIG. 10, the backside of the backside-pattern 26 is connected to the terminal 4 using a conductive bonding layer 27. The conductive bonding layer 27 is a conductive bonding material such as solder, brazing filler metal. For example, when the conductive bonding layer 27 is a solder, the backside-pattern 26 may be plated to facilitate soldering.

As shown in FIG. 8, each of the three terminals 4 is formed long in the Y-direction and thick in the Z-direction. The three terminals 4 are arranged on the backside of the substrate 211 and aligned in the X-direction. In the terminal 4, one end is soldered to a pattern of the backside 211*b* of the substrate 211 in the Y-direction, and the other end protrudes from the substrate 211 to form a bolt-insertion hole 41 for connection to the U-phase wiring (see 13*u* in FIG. 7), the V-phase wiring (see 13*v* in FIG. 7), or the W-phase wiring (see 13*w* in FIG. 7).

As shown in FIGS. 8 and 10, the substrate 211, three resistive-conducting layers 212, nine capacitors 22, and nine balance resistors 24 are embedded in an embedding resin 10. The embedding resin 10 has a rectangular shape that is flat in the Z-direction and long in the X-direction. For example, the height of the embedding resin 10 in the Z-direction (i.e., the overall height of the surge suppression device 1 in the Z-direction) is five times or less than the thickness of the terminal 4. In the terminal 4, the side to be connected to the backside-pattern 26 is embedded in the embedding resin 10, and the opposite side is exposed from the embedding resin 10. In the forming direction (Y-direction) of the terminal 4, the length of the portion exposed from the embedding resin 10 in the terminal 4 is longer than the length of the portion embedded in the embedding resin 10 in the terminal 4. When the terminal 4 has a bent shape, the forming direction as described above is the bent direction along the current path from one end of the terminal 4 to the other. The material for the embedding resin 10 can be the same as the resistor-embedding resin (see, for example, 6 in FIG. 2) or capacitor-embedding resin (see 7 in FIG. 2).

Functions and Effects of the Third Embodiment

The capacitor 22 is arranged on the substrate 211. In other words, since the resistive-conducting layer 212 is formed on the substrate 211 and the capacitor 22 is arranged on the substrate 211, the resistive-conducting layer 212 and the capacitor 22 can be integrated on the substrate 211, making it easy to achieve miniaturization of the surge suppression device 1.

The plural resistive-conducting layers 212 and the plural capacitors 22 are arranged on a single substrate 211. Therefore, it is possible to achieve further miniaturization of the surge suppression device 1.

The terminal 4 is mounted on one side of the substrate 211 in the thickness direction (i.e., Z-direction), and the resistive-conducting layer 212 is mounted on the other side of the substrate 211 in the thickness direction and is arranged in a position overlapping the terminal 4 in the thickness direction of the substrate 211. Hence, the heat of the resistive-conducting layer 212, which tends to generate heat, can easily be dissipated through the substrate 211 to the terminal 4.

The resistive-conducting layer 212 is formed longitudinally in the longitudinal direction of the terminal 4. Hence, it is easy to form the resistive-conducting layer 212 and the terminal 4 in a position overlapping in the Z-direction.

The through-conductive portion 25 electrically connected to the resistive-conducting layer 212 and formed to penetrate through the substrate 211 is further provided, and the through-conductive portion 25 is formed at a distance from the resistive-conducting layer 212. Hence, heat transfer from the resistive-conducting layer 212 to the through-conductive portion 25 can be suppressed, and thermal stress between the through-conductive portion 25 and the substrate 211 is suppressed. Other similar functions and effects are achieved.

Summary of the Embodiments

Next, the technical concepts that can be grasped from the above embodiments are described with the help of the characters. However, each character in the following description is not limited to the members specifically shown in the embodiments as the elements in the claims.

According to the first feature, a surge suppression device 1 is provided with a resistor 21 and a capacitor 22 electrically connected to the resistor 21, and the resistor 21 has a substrate 211 and a resistive-conducting layer 212 composed of a sintered resistive paste formed on the substrate 211.

According to the second feature, in the surge suppression device 1 as described in the first feature, a plurality of the resistive-conducting layers 212 are arranged on the substrate 211.

According to the third feature, in the surge suppression device 1 as described in the first feature, the capacitor 22 is arranged on the substrate 211.

According to the fourth feature, the surge suppression device 1 as described in any one of the first to third features includes a plurality of the resistive-conducting layers 212 and a plurality of the capacitors 22 electrically connected to the plurality of the resistive-conducting layers 212 respectively, and the plurality of the resistive-conducting layers 212 and the plurality of the capacitors 22 are arranged on one the substrate 211.

According to the fifth feature, the surge suppression device 1 as described in any one of the first to fourth features further includes a terminal 4 electrically connected to the resistive-conducting layer 212, in which the terminal 4 is arranged on one side of the substrate 211 in the thickness direction Z, the resistive-conducting layer 212 is arranged on the other side of the substrate 211 in the thickness direction Z and arranged in a position overlapping the terminals 4 in the thickness direction Z.

According to the sixth feature, in the surge suppression device 1 as described in the fifth feature, the resistive-conducting layer 212 is formed long in the longitudinal direction Y of the terminal 4.

According to the seventh feature, the surge suppression device 1 as described in the fourth feature further includes an embedding resin 10 that embeds the one substrate 211, the plurality of the resistive-conducting layers 212 and the plurality of the capacitors 22, and the embedding resin 10 includes a base resin and a filler having a higher thermal conductivity than the base resin.

According to the eighth feature, the surge suppression device 1 as described in any one of the first to seventh features further includes a through-conductive portion 25 electrically connected to the resistive-conducting layer 212 and formed to penetrate the substrate 211, and the through-conductive portion 25 is formed at a distance from the resistive-conducting layer 212.

According to the ninth feature, in the surge suppression device 1 as described in the first feature, the resistive-conducting layer 212 has a serpentine shape.

According to the tenth feature, in the surge suppression device 1 as described in the first or ninth feature, the capacitor 22 is located on one side of the substrate 211 in the thickness direction of the substrate 211.

According to the eleventh feature, the surge suppression device 1 as described in any one of the first, ninth, and tenth features further includes a bracket 3 that contacts the resistor 21 facing the substrate 211 and is fixed to a fixed object.

According to the twelfth feature, in the surge suppression device 1 as described in the eleventh feature, at least a part of the bracket 3 is interposed between the resistor 21 and the capacitor 22.

According to the thirteenth feature, in the surge suppression device 1 as described in the eleventh or twelfth feature, the substrate 211 has a pair of protrusions 211*c* protruding on both sides from the bracket 3, and electrodes 213 of the resistor 21 are formed on the pair of protrusions 211*c*.

According to the fourteenth feature, the surge suppression device 1 as described in any one of the first, ninth, and thirteenth features further includes a resistor-embedding resin 6 in which the resistor 21 is embedded and a capacitor-embedding resin 7 in which the capacitor 22 is embedded, and the resistor-embedding resin 6 and the capacitor-embedding resin 7 are arranged apart from each other.

According to the fifteenth feature, in the surge suppression device 1 as described in the fourteenth feature, each of the resistor-embedding resin 6 and the capacitor-embedding resin 7 has a base resin and a filler having a higher thermal conductivity than the base resin.

The description of the embodiments does not limit the inventions according to the claims. It should also be noted that not all of the combinations of features described are essential to the invention. In addition, the invention can be implemented with appropriate modifications to the extent that it does not depart from the gist of the invention.

The invention claimed is:

1. A surge suppression device, comprising:

a resistor; and a capacitor electrically connected to the resistor, wherein the resistor includes a substrate and a resistive-conducting layer composed of a sintered resistive paste provided on the substrate, and wherein the capacitor is arranged on the substrate.

2. The surge suppression device according to claim 1, wherein the resistive-conducting layer comprises a plurality of resistive-conducting layers that are arranged on the substrate.

3. The surge suppression device according to claim 1, further comprising:

a terminal electrically connected to the resistive-conducting layer, wherein the terminal is located on one side in a thickness direction of the substrate, and wherein the resistive-conducting layer is located on an other side in the thickness direction of the substrate and overlapping the terminal in the thickness direction of the substrate.

4. The surge suppression device according to claim 3, wherein the resistive-conducting layer is formed long in a longitudinal direction of the terminal.

5. The surge suppression device according to claim 1, further comprising: a through-conductive portion electrically connected to the resistive-conducting layer and formed to penetrate the substrate, wherein the through-conductive portion is provided at a portion distant from the resistive-conducting layer.

6. The surge suppression device according to claim 1, wherein the resistive-conducting layer has a serpentine shape.

7. The surge suppression device according to claim 1, wherein the capacitor is located on one side in a thickness direction of the substrate.

8. The surge suppression device according to claim 1, further comprising: a bracket that faces and contacts the substrate of the resistor and is secured to a fixing object.

9. The surge suppression device according to claim 8, wherein at least a part of the bracket is interposed between the resistor and the capacitor.

10. The surge suppression device according to claim 1, further comprising: a resistor-embedding resin in which the resistor is embedded; and a capacitor-embedding resin in which the capacitor is embedded, wherein the resistor-embedding resin and the capacitor-embedding resin are arranged apart from each other.

11. The surge suppression device according to claim 10, wherein each of the resistor-embedding resin and the capacitor-embedding resin comprises a base resin and a filler having a higher thermal conductivity than the base resin.

12. A surge suppression device, comprising:

a resistor; and a capacitor electrically connected to the resistor, wherein the resistor includes a substrate and a resistive-conducting layer composed of a sintered resistive paste provided on the substrate, wherein the resistive-conducting layer comprises a plurality of resistive-conducting layers and the capacitor comprises a plurality of capacitors electrically connected to the plurality of resistive-conducting layers respectively, and wherein the plurality of resistive-conducting layers and the plurality of capacitors are arranged on the substrate composed of a single substrate.

13. The surge suppression device according to claim 12, further comprising: an embedding resin in which the single substrate, the plurality of resistive-conducting layers and the plurality of capacitors are embedded, wherein the embedding resin comprises a base resin and a filler having a higher thermal conductivity than the base resin.

14. A surge suppression device, comprising:

a resistor; and a capacitor electrically connected to the resistor, wherein the resistor includes a substrate and a resistive-conducting layer composed of a sintered resistive paste provided on the substrate, further comprising: a bracket that faces and contacts the substrate of the resistor and is secured to a fixing object, wherein the substrate has a pair of protrusions protruding on both sides from the bracket, and wherein electrodes of the resistor are provided on the pair of protrusions.

* * * * *